United States Patent [19]
Shimizu

[11] Patent Number: 5,644,535
[45] Date of Patent: Jul. 1, 1997

[54] SEMICONDUCTOR DEVICE HAVING PLURAL MEMORIES WHICH SYNCHRONOUSLY GENERATE ACESS ALLOW SIGNALS

[75] Inventor: Tamio Shimizu, Tokyo, Japan

[73] Assignee: NEC Corporation, Japan

[21] Appl. No.: 626,240

[22] Filed: Mar. 29, 1996

[30] Foreign Application Priority Data

Mar. 30, 1995 [JP] Japan ................................. 7-072921

[51] Int. Cl.[6] ................................................. G11C 7/00
[52] U.S. Cl. ........................ 365/189.01; 365/49; 365/233
[58] Field of Search ........................... 365/189.01, 49, 365/233

[56] References Cited

U.S. PATENT DOCUMENTS

| | | | |
|---|---|---|---|
| 5,184,320 | 2/1993 | Dye | 365/49 |
| 5,226,009 | 7/1993 | Arimoto | 365/189.04 |
| 5,226,147 | 7/1993 | Fujishima et al. | 365/49 |
| 5,245,582 | 9/1993 | Kimura | 365/229 |

OTHER PUBLICATIONS

"QRAM—Quick Access Memory System" Ooba et al; 1990; IEEE; pp. 417–420.

*Primary Examiner*—David C. Nelms
*Assistant Examiner*—Hien Nguyen
*Attorney, Agent, or Firm*—Hayes, Soloway, Hennessey, Grossman & Hage, P.C.

[57] ABSTRACT

A memory access request signal is generated with activation of three different signals, i.e., memory select signal, operating mode signal and operating input signal. When only the memory select signal and operating mode signal are activated, internal operation is not executed, and only an operating mode for determining access allow signal generation timing is determined. The access allow signal is generated at the same timing as the execution of the operating mode.

6 Claims, 4 Drawing Sheets

SEMICONDUCTOR DEVICE HAVING PLURAL MEMORIES WHICH SYNCHRONOUSLY GENERATE ACESS ALLOW SIGNALS

BACKGROUND OF THE INVENTION

1. Field of the Invention

The present invention relates to semiconductor memories and, more particularly, to semiconductor memories controlled with access allow signal generation in response to an access request signal.

2. Brief Description of Related Prior Art

In a cache memory system capable of controlling access allow signal generation in response to the access request signal, the time until it is possible to output the data is different for cache hit operation and cache miss-hit judgment. Therefore, it is necessary to supply an access allow signal to an access controller for the cache memory to notify that it is or is not possible to use cache memory output data.

FIG. 6 is a block diagram showing a cache memory circuit. The operation of the cache memory system will now be described with reference to FIG. 6. The cache memory circuit comprises a main memory 8 which may be DRAM or the like having large memory capacity and relatively slow operation, a cache memory 9 capable of fast operation and for holding a copy of some of the data in the memory 8, a tag memory 12 capable of a fast memory operation and for holding the address data of the main memory 8 corresponding to the data held by the cache memory 9, a controller (not shown) for outputting address and control signals, an activating controller 13 for activating the tag memory 12 and the cache memory 9 according to received control signals, and a comparator 11 which receives part of input address data from the tag memory 12. The cache memory 9 also receives some address data. The comparator 11 compares the remaining input address bits and the output of the tag memory 12. When the two input data are in accord, a cache hit condition exists and a selector 10 generates the output of the cache memory 9 as the data output and also outputs an inverted access allow signal inversion RDY. Because of the use of fast memory operation, the data and inverted access allow signal RDY can be outputted in a short time from the instant of an access request.

When the output of the tag memory 12 fails to be in accord with the input address, it is judged as the cache miss. The memory 8 receives a non-accord signal from the comparator 11 and executes the accessing operation according to the input address to output the data to the selector 10. When the miss-hit judgment occurs, the selector 10 sends out the output data of the memory 8 to a data line (not shown). The data in the memory 8 is thus outputted as the output data. At the same time, the access allow signal (inverted RDY) is outputted in a timed relation to the data output from the memory 8. The cache memory 9 writes the data of the memory 8 that is read out from the same address, and the tag memory 12 writes the corresponding miss-hit address so as to be ready for the next access cycle. In the case of the miss-hit judgment, the data output and access allow signal are relatively slow as result of the access time of the memory 8. Thus, in connection with the data access time and access allow signal, the response time is different depending upon whether cache hit or cache miss-hit exists.

The write operation of this cache circuit will now be described. A write-back operation will be described, which requires an operation of holding the data in the cache memory 9 and main memory 8 in accord. In the write operation, the data are written in only the cache memory 9 at the cache hit time, thus curtailing the write cycle time. Since the data in the memory 8 have not been updated, the data in the memory 8 and cache memory 9 are different in the corresponding address.

In the event of miss-hit in the pertinent cache memory in a subsequent memory cycle, before writing the new data through erasing the data in the cache memory 9, the data in the cache memory 9 is written in the corresponding address of the memory 8, and the miss-hit data is accessed from the memory 8 for writing the data in the cache memory 9 and updating the data in the tag memory 12.

The data output in this case requires two memory cycles, and the access allow signal generation is greatly delayed. The memory including the above cache operation judging circuit requires four parallel devices in order to construct a 32-bit data bus in the case of 8 bit I/O.

The operation timing in which the write operation for single one of the parallel memories is executed, will now be described. Referring to FIG. 4, inverted memory select signal CS is inputted to memories 21 and 22. An address signal Add is also inputted to the memories 21 and 22. Inverted signal We1 is for writing data in the memory 21, and inverted signal We2 is for writing data in the memory 22. Inverted signal RDY1 is an access allow signal from an access allow signal generator 20 in the memory 21. Inverted signal RDY2 is an access allow signal from the access allow signal generator 20 in the memory 22. A NAND gate receives the inverted access allow signals RDY1 and RDY2 and provides an output thereof to the gate of an n-channel transistor 5. The transistor 5 has its source grounded, and provides inverted signal RDY from its gate through a resistor 3 to a power supply. When the inverted signal RDY is inverted to the low level, the memory can be accessed.

Operation will now be described with reference to the timing chart of FIG. 5. In memory cycle T1, the inverted memory select signal CS is activated to execute write operation for the memory 21. On the other hand, since the inverted write signal We2 is held inactive, no write operation is executed for the memory 22. In this cycle T1, the memories 21 and 22 are operated to generate the inverted access allow signals RDY1 and RDY2 substantially in the same timing. In the next memory cycle T2, the inverted memory select signal CS is activated. At this time, since the write operation has been executed for the memory 21 in the preceding cycle T1, a cache clear signal may be generated for the pertinent cache memory. In this case, after the activation of the inverted memory select signal CS a judgment as to whether the cache memory has been cleared is executed to execute writing operation of the write data in the memory cell and then accept allowance with respect to the address, to which the access request is generated. Therefore, the activation of the inverted allowed access signal RDY1 is delayed.

On the other hand, no write cycle has been executed for the memory 22, and the inverted access allow signal RDY2 is generated without delay due to the activation of the inverted memory select signal CS. In such a cycle, all the access allow signals generated from the memories in parallel operation are deviated. The memory access allowance, therefore, has to be timed to the latter one of the two signals.

This means that the NAND gate 4 shown in FIG. 4 has to take logic operation of the inverted access allow signal RDY1 and RDY2 before providing the access allow inverted signal RDY to signal line RDY, which is common to other devices, through a transistor 5. As for the inverted access allow signal RDY of the controller 42, the transistor 5 is arranged to provide an open-drain structure for wired OR of a plurality of access allow signals for devices other than memory (not shown).

However, where a plurality of semiconductor memory devices which have the above prior art signal input system and generate an access allow signal in response to an access request are operated in parallel, an extra external logic circuit is necessary for the access allow signals, and also a delay is produced in the access allow signal, for which the controller is required to provide the highest speed.

SUMMARY OF THE INVENTION

An object of the present invention is therefore to provide an access controlled semiconductor memory capable of generating access allow signals substantially with the same timing irrespective of occurrence of write operation in any one memory which needs no external logic circuit and makes it possible to attain faster provision of access allow signals.

According to the present invention, there is provided a semiconductor device comprising a memory cell array including a plurality of memory cells disposed in an array in directions of rows and columns, a plurality of bit line pairs each commonly connected to memory cells in each column, and a plurality of word lines each commonly connected to memory cells in each row, the semiconductor device being capable of memory operation of reading or writing data in or from some of the memory cells by activating predetermined ones of the bit line pairs and predetermined ones of the word lines, the memory operation being executed in response to a memory select signal, an operating mode signal and an operating input signal to generate an access allow signal for a memory array access request, the memory operation is not executed, a pseudo memory operation which determines only a predetermined operation mode of the memory operation is executed and the access allow signal is generated with a timing corresponding to the pseudo memory operation, when the memory select signal and operating mode signal are activated the operating input signal is deactivated. A plurality of data input/output lines having the same function as the operating input signal and the memory operation being executed for each of the data input/output line unit may be further added.

Other objects and features will clarified from the following description with reference to attached drawings.

PREFERRED EMBODIMENTS OF THE INVENTION

Figure 1:
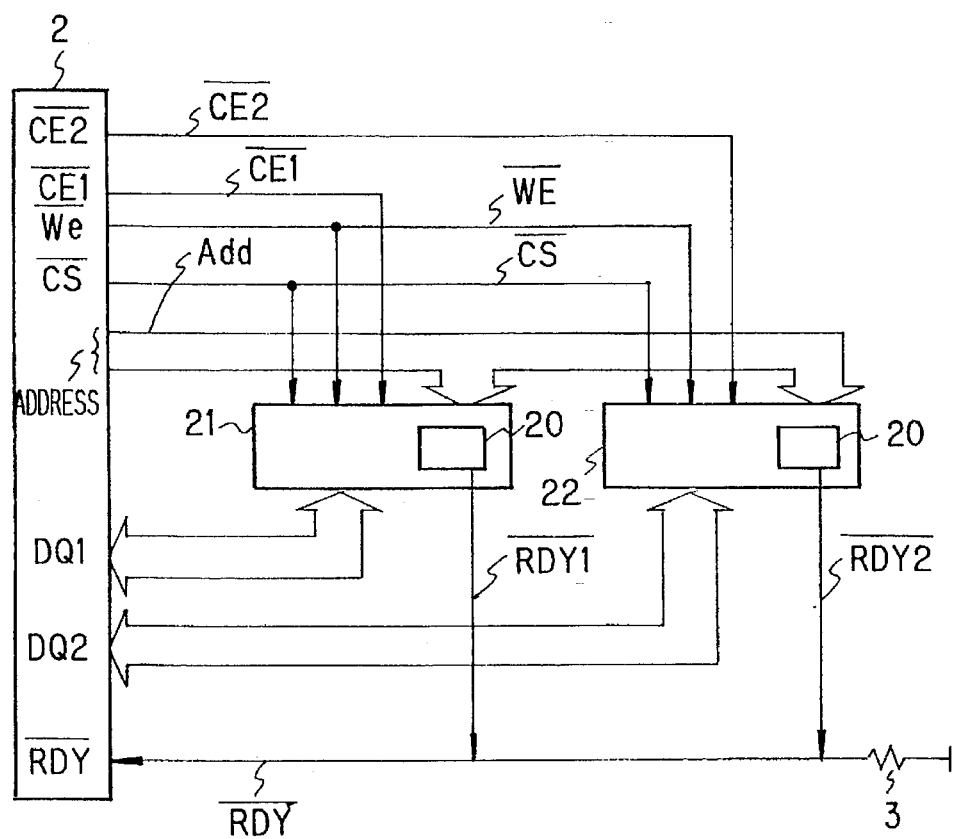
FIG. 1 is a block diagram showing a first embodiment of the semiconductor memory device according to the invention.

Now preferred embodiments of the present invention will be described. FIG. 1 is a block diagram showing a first embodiment of the semiconductor memory device according to the invention. Referring to FIG. 1, the embodiment of the semiconductor memory device comprises memories 21 and 22, which each include an access allow signal generator 20 operable for generating an access allow signal in response to receipt of inverted memory select signal CS, inverted operating mode signal We and inverted operating input signal CE. Inverted signal CS is commonly inputted to the memories 21 and 22, and also inverted signal WE is commonly inputted to the memories 21 and 22. Inverted operating input signal inversions CE1 and CE2 are inputted to the memories 21 and 22, respectively.

In this embodiment of the semiconductor memory device, the inverted access allow signal RDY1 and RDY2 of the memories 21 and 22 are wired ORed to produce the inverted common signal RDY, which is coupled as an open-drain type output through a resistor 3 to the power supply. The signals noted above are controlled by a controller 2.

Figure 2:
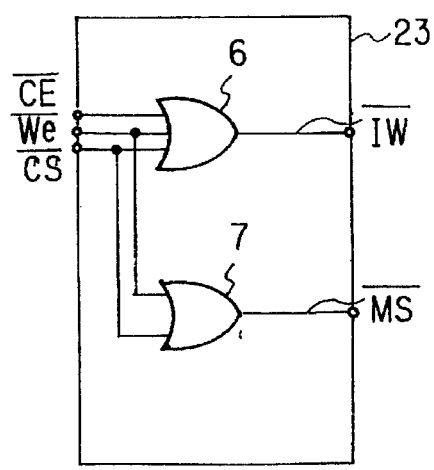
FIG. 2 is a block diagram showing a controller 23 for controlling signals inside memory.

The operation of this embodiment will now be described by also having reference to FIG. 2, which is a block diagram showing a controller 23 for controlling signals inside memory. Referring to FIG. 2, an OR gate 6, to which inverted signals CE, We and CS are inputted, outputs an internal write inverted signal IW. When the inverted signals CE, We and CS are all activated, the inverted signals IW is activated. When the signal IW is activated, a write operation mode is set in the semiconductor device of this embodiment, and write operation is executed for the memories 21 and 22. An OR gate 7, to which inverted signals CS and We are inputted, outputs an inverted mode select signal MS. When inverted signals We, CS and MS are activated the write operations for the memories 21 and 22 are prohibited. Then, in the access allow signal generators 20, corresponding address write mode is set. More specifically, when the inverted signal CS and We are inputted to the memories 21 and 22 while the inverted signal CE is not, the write operation prevails in the other one of the memories in parallel operation (for instance memory 22 among the memories 21 and 22). Thus, irrespective of occurrence of write operation in one of parallel operation memories, the access allow signal generator 20 judges that even devices not in write operation are in the write mode, and thus generates the inverted access allow signal RDY. It is thus possible to generate the access allow signal for a plurality of concurrent operation memories substantially at the same timing.

While the above description has concerned with parallel operation of two devices, this is only for the purpose of description and by no means limitative.

Figure 3:
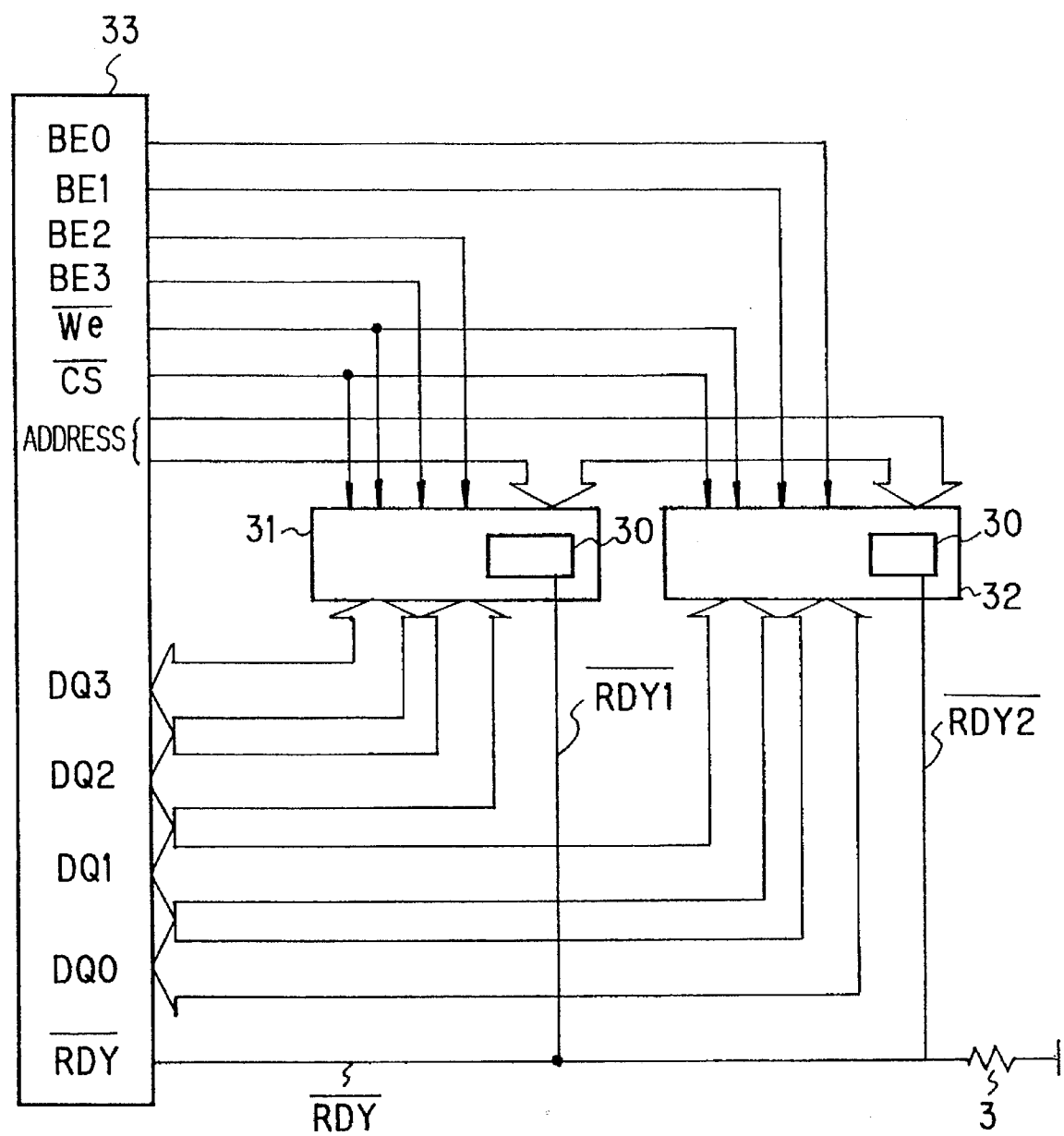
FIG. 3 is a block diagram showing a second embodiment of the semiconductor memory device according to the invention.
Figure 4:
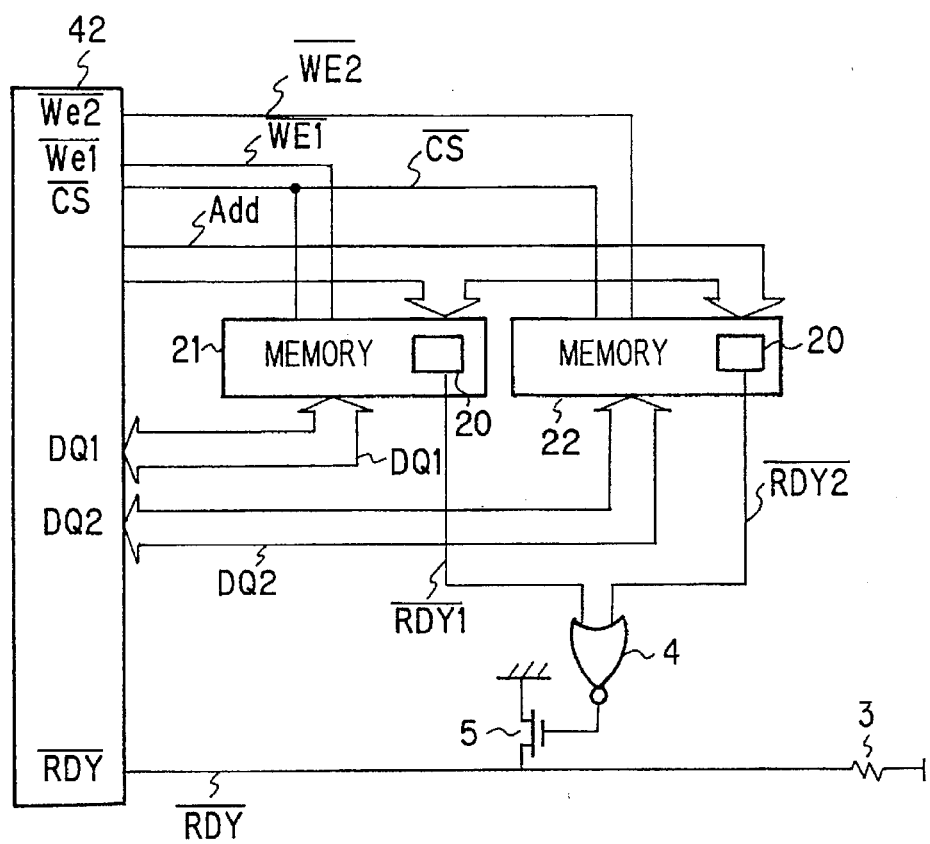
FIG. 4 is a block diagram for explaining a prior art cache memory circuit.
Figure 5:
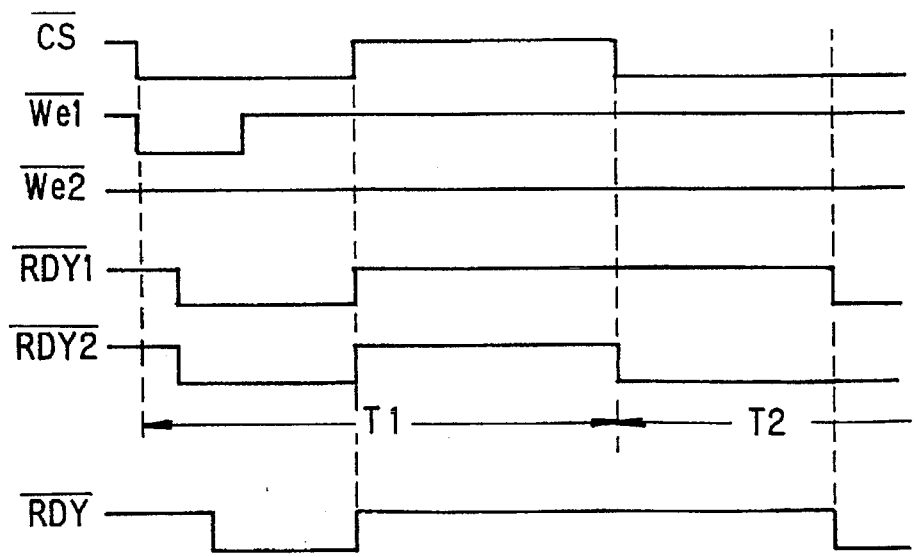
FIG. 5 is a timing chart for explaining the circuit of FIG. 4.
Figure 6:
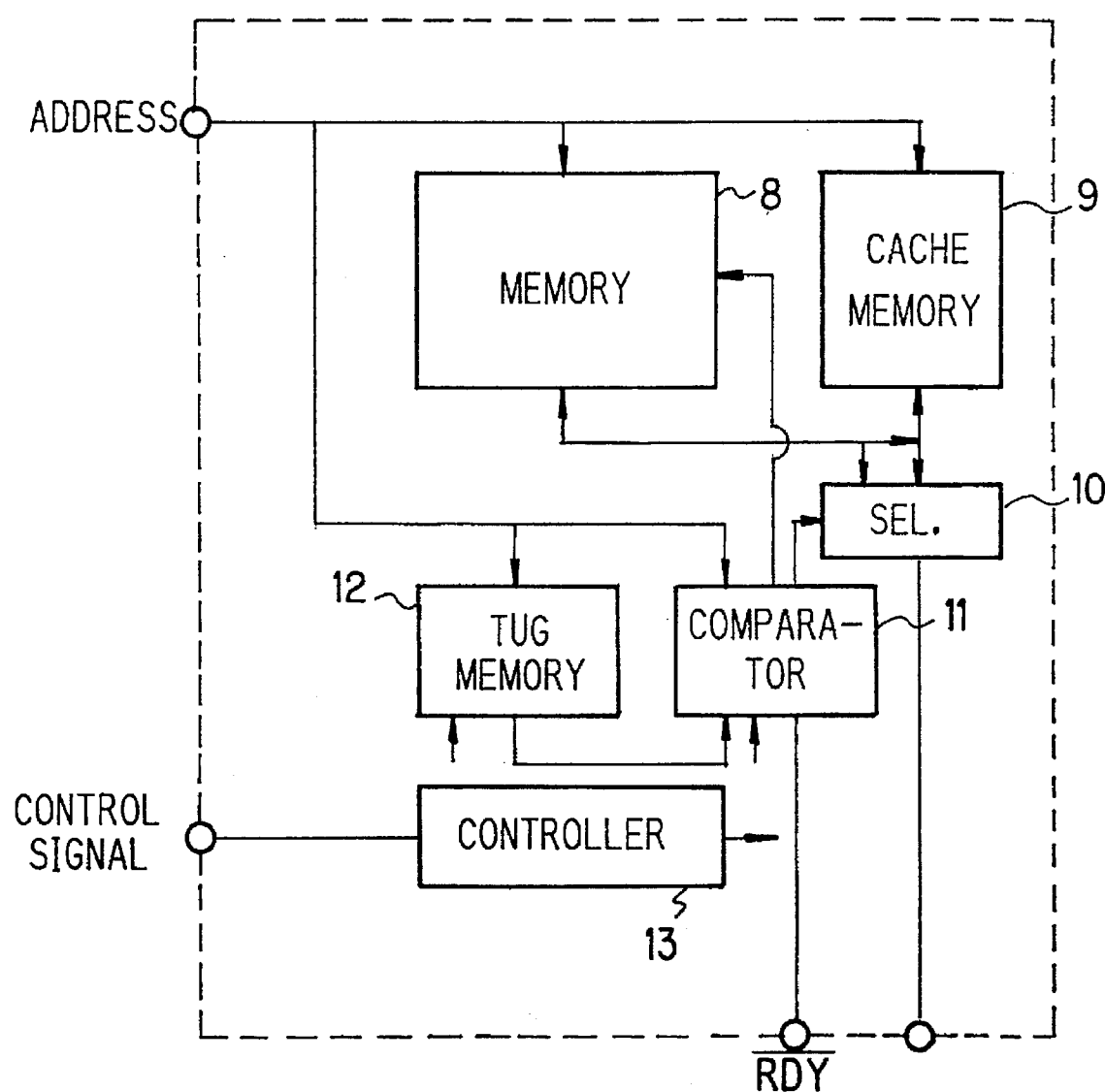
FIG. 6 is a block diagram showing a prior art cache memory circuit.

A second embodiment of the invention will now be described with reference to FIG. 3. This embodiment comprises memories 31 and 32, which each includes an access allow signal generator 30 for input and output of data from and to a controller 33 via a 16-bit data bus. The memories 31 and 32 have input/output control signal BE corresponding to their 8-bit units, and receive control signals (BE0 to BE3) from the controller 33. The coupling of the inverted signals CS and We, address and inverted signal RDY from the controller 33, is the same as in the first embodiment of the semiconductor memory device.

When the inverted memory select signal CS and inverted operating mode select signal We supplied to one memory (31 or 32) while the two signals BE are de-activated, the access allow signal generators 30 judge write operation. When at least one of the two signals BE is activated, normal write operation is brought about, and corresponding byte control is executed.

As shown, the memories 31 and 32 are not required to have any additional or new input terminal, and also no special control is required for the controller 33. It is thus possible to provide a fast access allow signal interface with a desired wired OR.

As has been described in the foregoing, according to the invention, a memory select signal, operation mode signal and operation input signal are provided for operating mode judgment. Thus, in parallel operation of two or more memories, access allow signals can be generated substantially with the same timing irrespective of occurrence of write operation in any one memory. Thus, no external logic circuit is needed, and it is possible to attain faster provision of access allow signals.

Changes in construction will occur to those skilled in the art and various apparently different modifications and embodiments may be made without departing from the scope of the invention. The matter set forth in the foregoing description and accompanying drawings is offered by way of illustration only. It is therefore intended that the foregoing description be regarded as illustrative rather than limiting.

What is claimed is:

1. A semiconductor device comprising a plurality of memories, a plurality of bit lines connected to said memories, and a plurality of word lines also connected to said memories, said memories being arranged to permit memory operation of writing or reading of data into or from said memories, each respective memory being arranged to execute a respective memory operation in response to activation of predetermined ones of said bit line pairs and word lines, a memory select signal, an operating mode signal, and at least one respective operating input signal, each respective memory also being arranged to generate a respective access allow signal when data in the respective memory is ready to be accessed, the respective memory operation not being executed by the respective memory if a condition exists in which the memory select signal and operating mode signal are activated and the respective operating input signal is de-activated, said respective memory being arranged to execute upon occurrence of said condition an allowing signal set operation wherein only a predetermined operation mode of the memory operation is determined, each said respective access allow signal being generated with a timing substantially corresponding to the allow signal set operation so as to permit substantially synchronous generation of the access allowing signals by the memories.

2. A semiconductor device according to claim 1, wherein said at least one respective operating input signal for each said respective memory comprises a respective plurality of input/output data, said input/output data being grouped into separate groups, and each said respective memory is arranged to execute separate respective allowing signal set operations in response to said separate groups of data.

3. A semiconductor device according to claim 1, wherein each respective memory includes a respective controller for controlling execution of respective memory and allowing signal set operations, said respective controller including two OR gates.

4. A semiconductor device according to claim 4, wherein said two OR gates are arranged to receive said memory select signal, said operating mode signal, and said at least one respective operating input signal.

5. A semiconductor device according to claim 4, wherein said two OR gates are arranged to generate a write operation mode control signal and mode select signal in response to said memory select signal, said operating mode signal, and said at least one respective operating input signal.

6. A semiconductor device according to claim 3, wherein one of said two OR gates is arranged to receive said memory select signal, said operating mode signal, and said at least one respective operating input signal, and the other of said two OR gates is arranged to receive said memory select signal and said operating mode signal.

* * * * *